(12) United States Patent
Raj et al.

(10) Patent No.: US 11,049,552 B1
(45) Date of Patent: Jun. 29, 2021

(54) WRITE ASSIST CIRCUITRY FOR MEMORY (71) Applicant: QUALCOMM Incorporated, San Diego, CA (US)

(72) Inventors: Pradeep Raj, Utter Pradesh (IN); Rahul Sahu, Bangalore (IN); Sharad Kumar Gupta, Bangalore (IN); Chulmin Jung, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/827,959

(22) Filed: Mar. 24, 2020

(51) Int. Cl.
*G11C 7/12* (2006.01)
*G11C 11/4094* (2006.01)
*G11C 11/4091* (2006.01)
*G11C 11/4074* (2006.01)
*G11C 11/4097* (2006.01)
*G11C 7/10* (2006.01)
*G11C 11/412* (2006.01)
*G11C 11/419* (2006.01)

(52) U.S. Cl.
CPC ........ *G11C 11/4094* (2013.01); *G11C 7/1096* (2013.01); *G11C 7/12* (2013.01); *G11C 11/4074* (2013.01); *G11C 11/4091* (2013.01); *G11C 11/4097* (2013.01); *G11C 11/412* (2013.01); *G11C 11/419* (2013.01)

(58) Field of Classification Search
CPC ............................ G11C 11/412; G11C 11/419
See application file for complete search history.

(56) References Cited

U.S. PATENT DOCUMENTS

| 9,349,438 | B2* | 5/2016 | Sano | G11C 11/419 |
| 9,401,201 | B1* | 7/2016 | Jung | G11C 7/1096 |
| 9,824,749 | B1* | 11/2017 | Nautiyal | G11C 11/413 |
| 9,865,337 | B1* | 1/2018 | Ahmed | G11C 7/12 |
| 10,199,092 | B2* | 2/2019 | Chanana | G11C 11/419 |
| 2017/0365331 | A1* | 12/2017 | Chanana | G11C 11/419 |
| 2018/0166129 | A1* | 6/2018 | Mehta | G11C 11/419 |

* cited by examiner

*Primary Examiner* — Mushfique Siddique
(74) *Attorney, Agent, or Firm* — Patterson & Sheridan, L.L.P.

(57) ABSTRACT

Certain aspects of the present disclosure are directed to a memory circuit. The memory circuit generally includes a memory cell coupled between a bit-line and a complementary bit-line. The memory circuit also includes a first n-type metal-oxide-semiconductor (NMOS) transistor configured to couple the bit-line to a write drive input during a write cycle of the memory circuit. The memory circuit also includes a second NMOS transistor configured to couple the complementary bit-line to a complementary write drive input during the write cycle, and a multiplexer circuit having a first p-type metal-oxide-semiconductor (PMOS) transistor coupled between a voltage rail and the bit-line or the complementary bit-line, the multiplexer circuit being configured to couple, via the first PMOS transistor, the bit-line or the complementary bit-line to the voltage rail during the write cycle.

20 Claims, 4 Drawing Sheets

WRITE ASSIST CIRCUITRY FOR MEMORY

FIELD OF THE DISCLOSURE

The teachings of the present disclosure relate generally to electronic systems, and more particularly, to circuitry for writing to memory.

BACKGROUND

Electronic devices including processors and memory are used extensively today in almost every electronic application. The processor controls the execution of program instructions, arithmetic functions, and access to memory and peripherals. In the simplest form, the processor executes program instructions by performing one or more arithmetic functions on data stored in memory. There are many different types of memory, which may be implemented using any of various suitable technologies.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are directed to a memory circuit. The memory circuit generally includes a memory cell coupled between a bit-line and a complementary bit-line. The memory circuit also includes a first n-type metal-oxide-semiconductor (NMOS) transistor configured to couple the bit-line to a write drive input during a write cycle of the memory circuit. The memory circuit also includes a second NMOS transistor configured to couple the complementary bit-line to a complementary write drive input during the write cycle, and a multiplexer circuit having a first p-type metal-oxide-semiconductor (PMOS) transistor coupled between a voltage rail and the bit-line or the complementary bit-line, the multiplexer circuit being configured to couple, via the first PMOS transistor, the bit-line or the complementary bit-line to the voltage rail during the write cycle.

Certain aspects of the present disclosure are directed to a method for writing to a memory cell coupled between a bit-line and a complementary bit-line. The method generally includes coupling, via a first n-type metal-oxide-semiconductor (NMOS) transistor, the bit-line to a write drive input during a write cycle. The method also includes coupling, via a second NMOS transistor, the complementary bit-line to a complementary write drive input during the write cycle, and coupling, via a first p-type metal-oxide-semiconductor (PMOS) transistor of a multiplexer circuit, the bit-line or the complementary bit-line to a voltage rail during the write cycle, where the first NMOS transistor is coupled between the voltage rail and the bit-line or the complementary bit-line.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the disclosure or the claims.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Example System-on-a-Chip (Soc)

Figure 1:
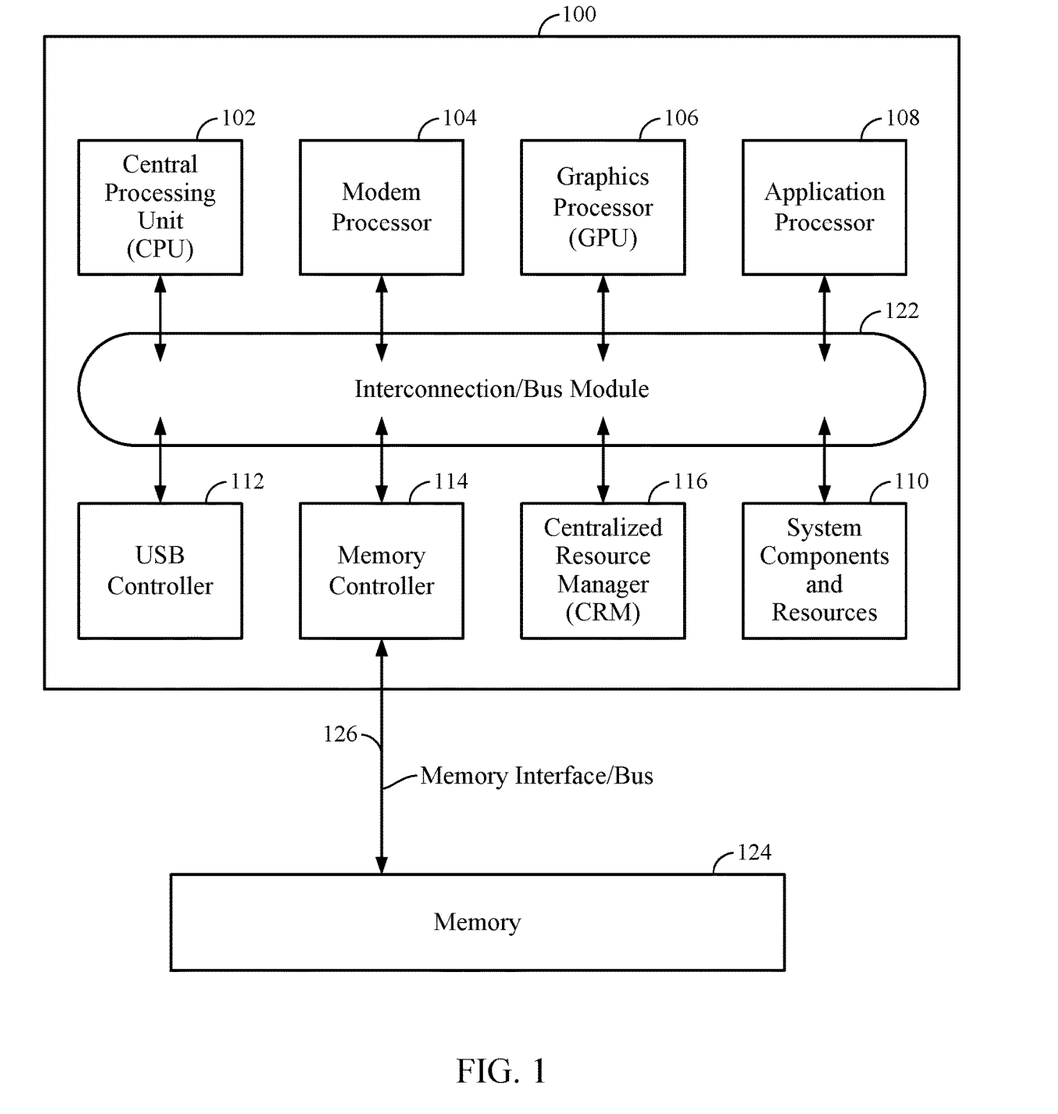
FIG. 1 is an illustration of an exemplary system-on-chip (SoC) integrated circuit design, in accordance with certain aspects of the present disclosure.

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via a memory interface/bus 126. For example, the memory controller 114 may include write assist circuitry, as described in more detail herein. In certain aspects, the memory 124 may be implemented using a static random-access memory (SRAM).

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Example SRAM Cell

Figure 2:
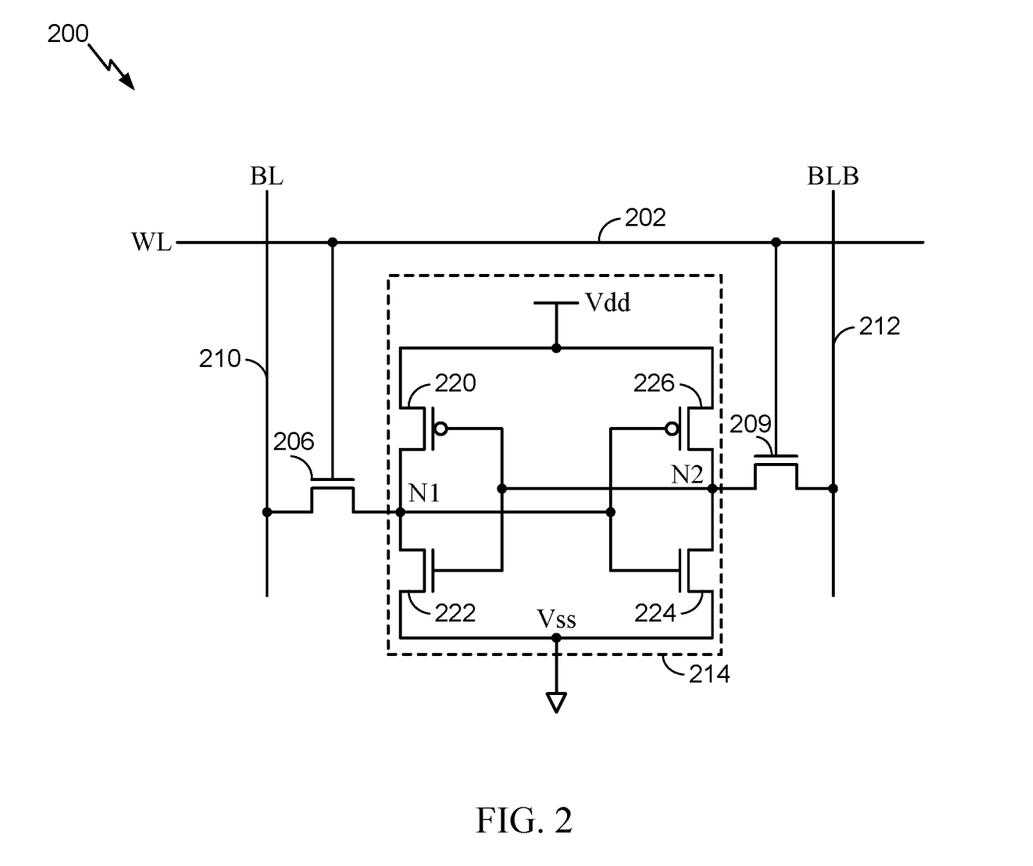
FIG. 2 illustrates an example static random-access memory (SRAM) cell.

FIG. 2 illustrates an example SRAM cell 200. The SRAM cell 200 may be part of an SRAM array including an array of word lines. Moreover, the SRAM array may include an array of bit lines (BLs), each having a complementary bit line (BLB). Each of the intersections of the BLs and WLs is associated with an SRAM cell (e.g. SRAM cell 200). As illustrated, the WL 202 is coupled to control inputs (gates) of pass gate (PG) transistors 206, 209 for selectively coupling respective bit lines (BL 210, BLB 212) to respective nodes N1, N2 (also referred to as an output node (e.g., SRAM internal output node), and a complementary output node (e.g., SRAM internal complementary output node), respectively) of a flip-flop (FF) 214. The pass gate transistor 206 and/or the pass gate transistor 209 may each be implemented using a metal-oxide-semiconductor (MOS) transistor.

As illustrated, the FF 214 is coupled between a voltage rail (Vdd) and a reference potential node (e.g., electric ground or Vss). The FF 214 includes a p-type metal-oxide-semiconductor (PMOS) transistor 220 having a drain coupled to a drain of an n-type metal-oxide-semiconductor (NMOS) transistor 222, forming part of node N1. The FF 214 also includes a PMOS transistor 226 having a drain coupled to a drain of an NMOS transistor 224, forming part of node N2. The gates of the PMOS transistor 220 and the NMOS transistor 222 are coupled to the node N2, and the gates of the PMOS transistor 226 and the NMOS transistor 224 are coupled to the node N1, as illustrated.

Example Charge Assist Circuitry

Certain aspects of the present disclosure are generally directed to charge assist circuitry for memory cells, such as memory cells of a static random-access memory (SRAM) memory array. When writing to a memory cell during a write cycle, a positive voltage representing logic high (e.g., Vdd) may be applied to one of a bit-line (BL) and a complementary bit-line (BLB) of the memory cell, and a negative voltage (e.g., also referred to as a negative BL (NBL) voltage) may be applied to the other one of the BL and the BLB. For example, a positive voltage (e.g., 1.082 V) may be applied to the BLB, and a negative voltage (e.g., −200 mV) may be applied to the BL, to write a logic low to the memory cell. During the write cycle, the positive voltage applied to the BLB (or BL) may drop due to, for example, a threshold voltage of a transistor used to couple the BLB to a voltage rail Vdd. Applying the negative voltage to the BL (or BLB) compensates for (or at least reduces) adverse effects on the write performance of the memory cell due to the voltage drop of the positive voltage. However, due to increased BL and BLB line resistance in newer generation memory devices, the transfer of a negative voltage to the BL (or BLB) is becoming more challenging. Therefore, a positive voltage may be applied to the BL with reduced voltage drop during a write cycle as compared to conventional implementations. Certain aspects are directed to a write data path implementation that allows for increased write sigma coverage for memory with high BL (or BLB) resistance. For example, while the BLB (or BL) of the memory cell may be charged to a negative voltage (e.g., −200 mV), the BL (or BLB) may be charged to a positive voltage (e.g., Vdd) using a p-type metal-oxide-semiconductor (PMOS) transistor, resulting in a reduction in the amount of voltage drop associated with applying the positive voltage to the BL as compared to implementations where only an n-type metal-oxide-semiconductor (NMOS) transistor is used to apply the positive voltage to the BL.

Figure 3:
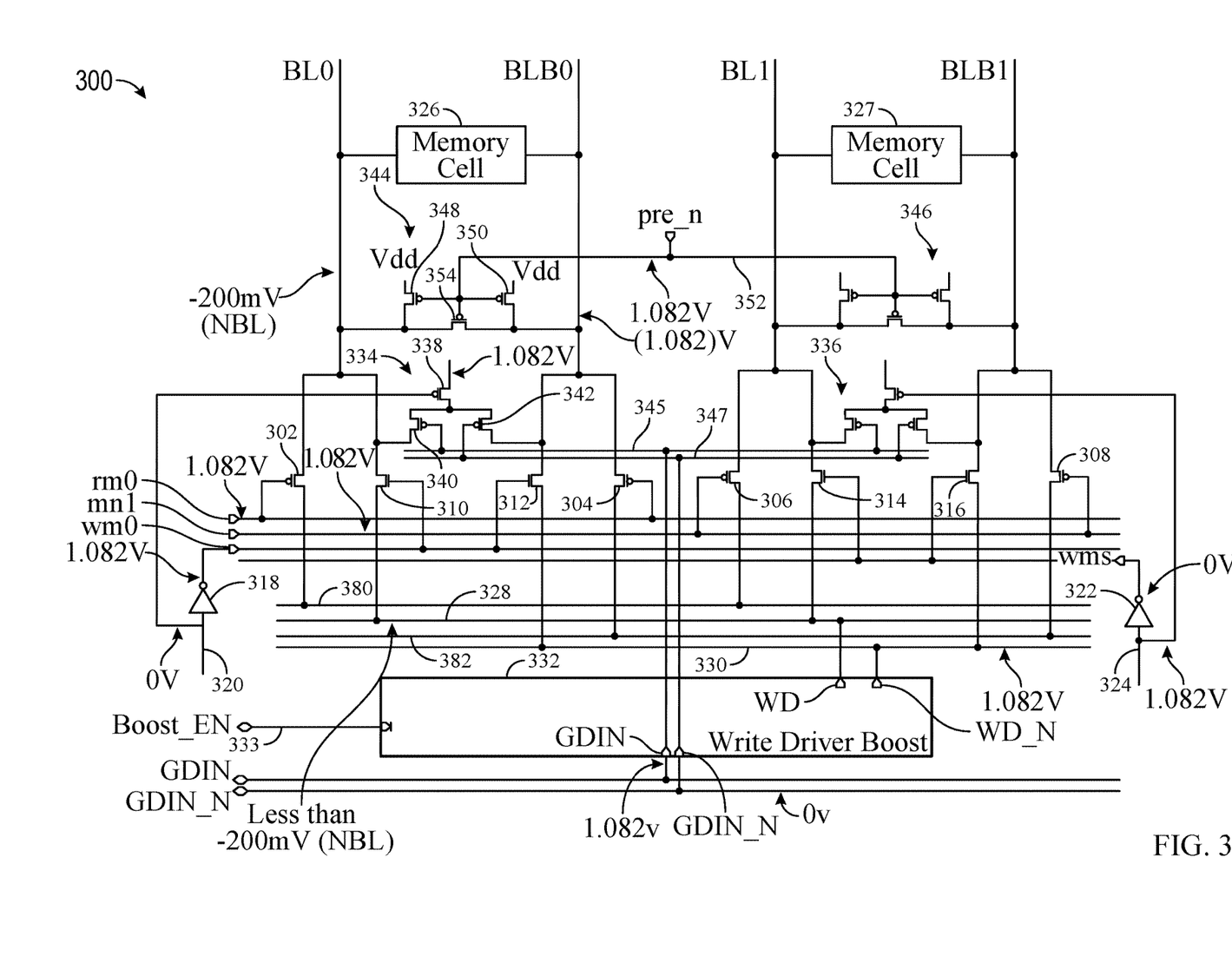
FIG. 3 illustrates an example memory circuit for reading from and writing to memory, in accordance with certain aspects of the present disclosure.

FIG. 3 illustrates an example memory circuit 300 for reading from and writing to memory, in accordance with certain aspects of the present disclosure. As illustrated, the memory circuit 300 may include PMOS transistors 302, 304, 306, 308 that facilitate a read cycle for the memory. For example, the PMOS transistors 302, 306 may be coupled between a read line 380 and a respective one of BL0 and BL1, and the PMOS transistors 304, 308 may be coupled between a complementary read line 382 and a respective one of BLB0 and BLB1.

The memory circuit 300 also includes NMOS transistors 310, 312, 314, 316 that facilitate a write cycle for the memory. For example, during a write cycle, the PMOS transistors 302, 304, 306, 308 may be turned off, and the NMOS transistors 310, 312, 314, 316 may be turned on. The gates of the NMOS transistors 310, 312 may be coupled to an output of an inverter 318, an input of the inverter 318 being coupled to a write input 320, as illustrated. The write input 320 may be used to activate the write cycle for a memory cell 326 (e.g., corresponding to the SRAM cell 200) coupled between BL0 and BLB0. Moreover, the gates of the NMOS transistors 314, 316 may be coupled to the output of an inverter 322, the input of the inverter 322 being coupled to a write input 324.

For example, when data is to be written to the memory cell 326, a voltage representing logic low (e.g., 0 V) may be applied to the write input 320 such that the gates of the NMOS transistors 310, 312 coupled to the output of the inverter 318 are at Vdd (e.g., 1.082 V), turning on the NMOS transistors 310, 312. As illustrated, the sources of the NMOS transistors 310, 312 are coupled to a write data (WD) input 328 and a negative WD (WD_N) input 330, respectively. To write a logic low to the memory cell 326, the write driver boost circuit 332 may provide a voltage that is less than −200 mV to the WD input 328 such that the voltage at BL0 is at −200 mV when the NMOS transistors 310, 312 are turned on. Moreover, the write driver boost circuit 332 may apply Vdd (e.g., 1.082 V) to the source of the NMOS transistor 312 via the WD_N input 330. As illustrated, the write driver boost circuit 332 may be enabled via a boost enable (BOOST_EN) input 333.

In certain aspects, a multiplexer circuit 334 may be coupled between BL0 and BLB0, and a multiplexer circuit 336 may be coupled between BL1 and BLB1, as illustrated. Each of the multiplexer circuits 334, 336 is configured to provide Vdd (e.g., 1.082 V) to the BL or BLB depending on whether a logic high or logic low is being written to a corresponding one of the memory cells 326, 327. For example, the multiplexer circuit 334 may include a PMOS transistor 338 having a drain coupled to sources of PMOS transistors 340, 342 of the multiplexer circuit 334. The drains of PMOS transistors 340, 342 are coupled to BL0 and BLB0, respectively. The gate of the PMOS transistor 340 may be coupled to the global data input (GDIN) 345, and the gate of the PMOS transistor 342 may be coupled to the negative GDIN (GDIN_N) 347.

As described herein, when the write input 320 is at logic low, the output of the inverter 318 is at logic high, turning on NMOS transistors 310, 312 for the write cycle. Moreover, when the write input 320 is at logic low, the PMOS transistor 338 is turned on, providing Vdd to the sources of PMOS transistors 340, 342 of the multiplexer circuit 334. If a logic low is being written to the memory cell 326, GDIN 345 may be at logic high, and GDIN_N 347 may be at logic low, turning off the PMOS transistor 340 and turning on the PMOS transistor 342, providing Vdd to BLB0 while BL0 is provided a negative voltage (e.g., −200 mV) through the NMOS transistor 310.

The NMOS transistor 312 is also turned on while the PMOS transistor 342 is turned on. The NMOS transistor 312 also couples BLB0 to Vdd (e.g., 1.082 V at WD_N line 330). However, without the multiplexer circuit 334, BLB0 would be at Vdd minus a voltage drop associated with the threshold voltage of the NMOS transistor 312. The multiplexer circuit 334 sets the voltage at BLB0 to Vdd with less voltage drop as compared to an implementation without the multiplexer circuit 334, improving the write performance for the memory cell 326.

In some cases, a precharge circuit 344 may be coupled between BL0 and BLB0, and a precharge circuit 346 may be coupled between BL1 and BLB1. The precharge circuits 344, 346 are configured to charge BL0, BLB0, BL1, and BLB1 prior to the beginning of each write cycle and read cycle of the memory circuit. For example, the precharge circuit 344 includes PMOS transistors 348, 350 coupled between Vdd and a respective one of BL0 and BLB0. The PMOS transistors 348, 350 may be turned on via a precharge control node 352 (pre n), coupling BL0 and BLB0 to Vdd during a precharge phase. Moreover, a PMOS transistor 354 may be coupled between BL0 and BLB0. A gate of the PMOS transistor 354 is also coupled to the precharge control node 352. The PMOS transistor 354 may be used to electrically couple BL0 and BLB0 together to reduce any voltage offset between BL0 and BLB0 during the precharge phase.

Example Write Operations

Figure 4:
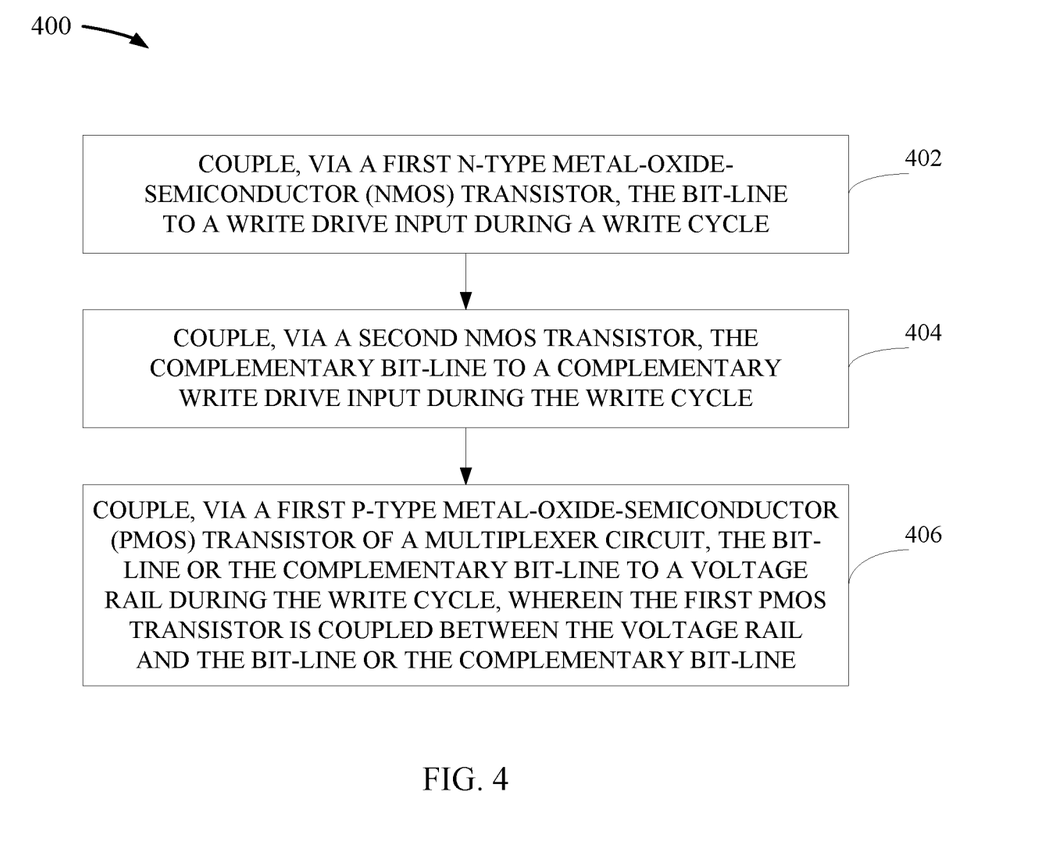
FIG. 4 is a flow diagram illustrating example operations for writing to a memory cell coupled between a bit-line and a complementary bit-line, in accordance with certain aspects of the present disclosure.

FIG. 4 is a flow diagram illustrating example operations 400 for writing to a memory cell (e.g., memory cell 326) coupled between a bit-line and a complementary bit-line, in accordance with certain aspects of the present disclosure. The operations 400 may be performed via a memory circuit, such as the memory circuit 300.

The operations 400 begin, at block 402, with the memory circuit coupling, via a first NMOS transistor (e.g., NMOS transistor 310), the bit-line (e.g., BLB0) to a write drive input (e.g., WD input 328) during a write cycle. At block 404, the memory circuit may couple, via a second NMOS transistor (e.g., NMOS transistor 312), the complementary bit-line to a complementary write drive input (e.g., WD_N input 330) during the write cycle, and at block 406, couple, via a first PMOS transistor (e.g., PMOS transistor 342 or PMOS transistor 340) of a multiplexer circuit (e.g., multiplexer circuit 334), the bit-line or the complementary bit-line to a voltage rail (e.g., Vdd) during the write cycle, wherein the first PMOS transistor is coupled between the voltage rail and the bit-line or the complementary bit-line.

In certain aspects, the coupling of the bit-line or the complementary bit-line to the voltage rail at block 406 may include coupling, via the first PMOS transistor, the voltage rail to one of the bit-line and the complementary bit-line during the write cycle, the voltage rail having a positive voltage with respect to a reference potential (e.g., Vss) of the memory cell. In this case, the operations 400 may also include coupling, via a write driver boost circuit (e.g., write driver boost circuit 332), another voltage rail to another one of the bit-line and the complementary bit-line during the write cycle, the other voltage rail having a negative voltage with respect to the reference potential of the memory cell.

In certain aspects, the coupling of the bit-line or the complementary bit-line to the voltage rail at block 406 may include coupling, via the first PMOS transistor (e.g., PMOS transistor 340), the bit-line to the voltage rail if the write drive input is at logic high during the write cycle. The operations 400 may also include coupling, via a second PMOS transistor (e.g., PMOS transistor 342) of the multiplexer circuit, the complementary bit-line to the voltage rail if the complementary write drive input is at logic high during the write cycle. In certain aspects, the operations 400 may also include selectively coupling, via a third PMOS transistor (e.g., PMOS transistor 338) of the multiplexer circuit, the voltage rail to sources of the first PMOS transistor and the second PMOS transistor.

In certain aspects, the operations 400 may also include coupling, via a second PMOS transistor (e.g., PMOS transistor 302), the bit-line to a read line (e.g., read line 380) during a read cycle, and coupling, via a third PMOS transistor (e.g., PMOS transistor 304), the complementary bit-line to a complementary read line (e.g., complementary read line 382) during the read cycle. In certain aspects, the operations 400 may also include coupling, via a second PMOS transistor (e.g., PMOS transistor 348), the voltage rail to the bit-line during a precharge phase, and coupling, via a third PMOS transistor (e.g., PMOS transistor 350), the voltage rail to the complementary bit-line during the precharge phase. In certain aspects, the operations 400 may also include coupling, via a fourth PMOS transistor (e.g., PMOS transistor 354), the bit-line to the complementary bit-line during the precharge phase.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A memory circuit comprising:
a memory cell coupled between a bit-line and a complementary bit-line;
a first n-type metal-oxide-semiconductor (NMOS) transistor configured to couple the bit-line to a write drive input during a write cycle of the memory circuit;
a second NMOS transistor configured to couple the complementary bit-line to a complementary write drive input during the write cycle; and
a multiplexer circuit having a first p-type metal-oxide-semiconductor (PMOS) transistor coupled between a voltage rail and the bit-line or the complementary bit-line, the multiplexer circuit being configured to couple, via the first PMOS transistor, the bit-line or the complementary bit-line to the voltage rail during the write cycle, wherein:
the multiplexer circuit is configured to couple, via the first PMOS transistor, the voltage rail to one of the bit-line and the complementary bit-line during the write cycle while another one of the bit-line and the complementary bit-line is coupled to another voltage rail;
the voltage rail is configured to have a positive voltage with respect to a reference potential of the memory cell; and
the other voltage rail is configured to have a negative voltage with respect to the reference potential of the memory cell.

2. The memory circuit of claim 1, wherein:
the memory circuit further comprises a write driver boost circuit configured to couple the other voltage rail to the other one of the bit-line and the complementary bit-line during the write cycle.

3. The memory circuit of claim 1, wherein the first PMOS transistor is coupled between the voltage rail and the bit-line, and wherein the multiplexer circuit further comprises a second PMOS transistor coupled between the voltage rail and the complementary bit-line.

4. The memory circuit of claim 3, wherein the multiplexer circuit is configured to:
couple, via the first PMOS transistor, the bit-line to the voltage rail if the write drive input is at logic high during the write cycle; or
couple, via the second PMOS transistor, the complementary bit-line to the voltage rail if the complementary write drive input is at logic high during the write cycle.

5. The memory circuit of claim 3, wherein the multiplexer circuit further comprises a third PMOS transistor coupled between the voltage rail and sources of the first PMOS transistor and the second PMOS transistor.

6. The memory circuit of claim 5, wherein the multiplexer circuit is configured to couple, via the third PMOS transistor, the sources of the first PMOS transistor and the second PMOS transistor to the voltage rail during the write cycle.

7. The memory circuit of claim 5, further comprising an inverter, wherein an input of the inverter is coupled to a gate of the third PMOS transistor and wherein an output of the inverter is coupled to gates of the first NMOS transistor and the second NMOS transistor.

8. The memory circuit of claim 1, further comprising:
a second PMOS transistor configured to couple the bit-line to a read line during a read cycle of the memory circuit; and
a third PMOS transistor configured to couple the complementary bit-line to a complementary read line during the read cycle.

9. The memory circuit of claim 1, further comprising a precharge circuit comprising:
a second PMOS transistor coupled between the voltage rail and the bit-line; and
a third PMOS transistor coupled between the voltage rail and the complementary bit-line, gates of the second PMOS transistor and the third PMOS transistor being coupled to a precharge control node.

10. The memory circuit of claim 9, wherein the precharge circuit further comprises a fourth PMOS transistor coupled between the bit-line and the complementary bit-line, a gate of the fourth PMOS transistor being coupled to the precharge control node.

11. The memory circuit of claim 1, further comprising:
another memory cell coupled between another bit-line and another complementary bit-line;
a third NMOS transistor configured to couple the other bit-line to the write drive input;
a fourth NMOS transistor configured to couple the other complementary bit-line to the complementary write drive input; and
another multiplexer circuit having a second PMOS transistor coupled between the voltage rail and the other bit-line or the other complementary bit-line, a gate of the first PMOS transistor being coupled to a gate of the second PMOS transistor.

12. The memory circuit of claim 1, wherein the memory cell comprises a static random-access memory (SRAM) cell.

13. A method for writing to a memory cell coupled between a bit-line and a complementary bit-line, comprising:
coupling, via a first n-type metal-oxide-semiconductor (NMOS) transistor, the bit-line to a write drive input during a write cycle;
coupling, via a second NMOS transistor, the complementary bit-line to a complementary write drive input during the write cycle; and
coupling, via a first p-type metal-oxide-semiconductor (PMOS) transistor of a multiplexer circuit, the bit-line or the complementary bit-line to a voltage rail during the write cycle, wherein:
the first PMOS transistor is coupled between the voltage rail and the bit-line or the complementary bit-line;
the coupling of the bit-line or the complementary bit-line to the voltage rail comprises coupling, via the first PMOS transistor, the voltage rail to one of the bit-line and the complementary bit-line during the write cycle while another one of the bit-line and the complementary bit-line is coupled to another voltage rail;
the voltage rail has a positive voltage with respect to a reference potential of the memory cell; and
the other voltage rail has a negative voltage with respect to the reference potential of the memory cell.

14. The method of claim 13, wherein:
the method further comprises coupling, via a write driver boost circuit, the other voltage rail to the other one of the bit-line and the complementary bit-line during the write cycle.

15. The method of claim 13, wherein:
the coupling of the bit-line or the complementary bit-line to the voltage rail comprises coupling, via the first PMOS transistor, the bit-line to the voltage rail if the write drive input is at logic high during the write cycle; and the method further comprises coupling, via a second PMOS transistor of the multiplexer circuit, the complementary bit-line to the voltage rail if the complementary write drive input is at logic high during the write cycle.

16. The method of claim 15, further comprising selectively coupling, via a third PMOS transistor of the multiplexer circuit, the voltage rail to sources of the first PMOS transistor and the second PMOS transistor.

17. The method of claim 13, further comprising:
coupling, via a second PMOS transistor, the bit-line to a read line during a read cycle; and
coupling, via a third PMOS transistor, the complementary bit-line to a complementary read line during the read cycle.

18. The method of claim 13, wherein the memory cell comprises a static random-access memory (SRAM) cell.

19. The method of claim 13, further comprising:
coupling, via a second PMOS transistor, the voltage rail to the bit-line during a precharge phase; and
coupling, via a third PMOS transistor, the voltage rail to the complementary bit-line during the precharge phase.

20. The method of claim 19, further comprising:
coupling, via a fourth PMOS transistor, the bit-line to the complementary bit-line during the precharge phase.

* * * * *